United States Patent
Wang et al.

(10) Patent No.: US 12,393,127 B2
(45) Date of Patent: Aug. 19, 2025

(54) EXPOSURE LIGHT BEAM PHASE MEASUREMENT METHOD IN LASER INTERFERENCE PHOTOLITHOGRAPHY, AND PHOTOLITHOGRAPHY SYSTEM

(71) Applicants: TSINGHUA UNIVERSITY, Beijing (CN); BEIJING U-PRECISION TECH CO., LTD., Beijing (CN)

(72) Inventors: Leijie Wang, Beijing (CN); Yu Zhu, Beijing (CN); Ming Zhang, Beijing (CN); Jitao Xu, Beijing (CN); Rong Cheng, Beijing (CN); Xin Li, Beijing (CN); Kaiming Yang, Beijing (CN); Jinchun Hu, Beijing (CN)

(73) Assignees: Tsinghua University, Beijing (CN); Beijing U-Precision Tech Co., Ltd., Beijing (CN)

( * ) Notice: Subject to any disclaimer, the term of this patent is extended or adjusted under 35 U.S.C. 154(b) by 713 days.

(21) Appl. No.: 17/767,399

(22) PCT Filed: Oct. 23, 2020

(86) PCT No.: PCT/CN2020/123222
§ 371 (c)(1),
(2) Date: Apr. 7, 2022

(87) PCT Pub. No.: WO2021/083043
PCT Pub. Date: May 6, 2021

(65) Prior Publication Data
US 2024/0061352 A1     Feb. 22, 2024

(30) Foreign Application Priority Data
Oct. 31, 2019 (CN) .......................... 201911050178.6

(51) Int. Cl.
*G03F 7/00* (2006.01)
*G03F 7/20* (2006.01)

(52) U.S. Cl.
CPC .......... *G03F 7/7085* (2013.01); *G03F 7/2006* (2013.01); *G03F 7/70408* (2013.01)

(58) Field of Classification Search
CPC .. G03F 7/2006; G03F 7/70408; G03F 7/7055; G03F 7/7085

(Continued)

(56) References Cited

U.S. PATENT DOCUMENTS 6,882,477 B1    4/2005   Schattenburg et al.

FOREIGN PATENT DOCUMENTS

| CN | 101413783 A | 4/2009 |
|---|---|---|
| CN | 101762242 A | 6/2010 |

(Continued)

*Primary Examiner* — Sunghee Y Gray
(74) *Attorney, Agent, or Firm* — Holzer Patel Drennan

(57) ABSTRACT

An exposure light beam phase measurement method for laser interference photolithography comprises: separating a measurement light from an exposure light beam and inputting light into a laser phase measurement interferometer to carry out phase measurement on the exposure light beam; inputting a reference light beam homologous with the exposure light beam into the laser phase measurement interferometer; processing the reference light beam to form an interference measurement optical signal; calculating to obtain the phase of the exposure light beam. A laser interference photolithography system using the method comprises a laser phase measurement interferometer, a controller and phase modulators, the laser phase measurement interferometer measures whether the phase of an exposure light beam drifts, the controller controls phase modulators to carry out phase modulation, to achieve locking of exposure (Continued)

stripe phase drift and manufacturing of a high-precision variable-period optical grating.

10 Claims, 2 Drawing Sheets

(58) Field of Classification Search
USPC .......................................................... 356/487
See application file for complete search history.

(56) References Cited

FOREIGN PATENT DOCUMENTS

| | | |
|---|---|---|
| CN | 102944176 A | 2/2013 |
| CN | 103092002 A | 5/2013 |
| CN | 103698983 A | 4/2014 |
| CN | 106225667 A | 12/2016 |
| CN | 110716397 A | 1/2020 |
| CN | 110806680 A | 2/2020 |
| CN | 110837214 A | 2/2020 |
| EP | 0534757 A1 | 3/1993 |
| EP | 1169613 A1 | 1/2002 |
| JP | H042116 A | 1/1992 |
| WO | WO-2019210734 A1 * 11/2019 ............. G01B 11/02 |

* cited by examiner

EXPOSURE LIGHT BEAM PHASE MEASUREMENT METHOD IN LASER INTERFERENCE PHOTOLITHOGRAPHY, AND PHOTOLITHOGRAPHY SYSTEM

This application claims the priority and benefit of the Chinese Patent Application No. 201911050178.6 filed on Oct. 31, 2019, which is hereby incorporated by reference in its entirety.

TECHNICAL FIELD

This application belongs to the technical field of optical instruments apparatus, in particular, to an exposure light beam phase measurement method for laser interference photolithography and a photolithography system.

BACKGROUND ART

Grating devices are important devices in major engineering systems such as large astronomical telescope, inertial confinement nuclear fusion laser ignition system and photolithography system, etc., the requirements for size, grid line density and accuracy and the like thereof have been continuously improved in recent years. At the same time, the application types of gratings are not limited to one-dimensional gratings, but also include two-dimensional gratings, curved gratings and variable period gratings, etc. The grating manufacturing process is towards to the magnitude order of meter size, nano accuracy and sub-ten thousand grid line density. The manufacturing method of large-size gratings with diversified high-accuracy dense grid lines has become a central issue in the field of grating manufacturing.

There are different technical defects in traditional grating manufacturing technologies such as mechanical engraving, laser direct writing and mechanical splicing, etc. The main disadvantages of the mechanical engraving include low manufacturing accuracy in large area, long processing cycle and ghost lines existing in the manufactured grating, etc. The main disadvantages of the laser direct writing include low manufacturing accuracy in large area and long processing cycle, etc. The mechanical splicing has poor splicing accuracy and complex splicing process, high cost and other disadvantages. Therefore, it is difficult to manufacture the above-mentioned magnitude order of gratings through traditional technologies. Laser interference photolithography is an important technology for manufacturing the micro-nano array device by exposing a photosensitive substrate using a periodic pattern generated by the interference of two or more laser beams, and laser interference photolithography is mainly used to manufacture column array, grating, aperture array, dot array, micro-lens array, and other devices with feature sizes lower than the sub-wavelength. These micro-nano array devices are widely used in fields such as national defense, people's livelihood, scientific research, etc. The manufacture of large area gratings with dense grid lines, high accuracy and short processing cycle can be achieved through laser interference photolithography or holographic photolithography, and the laser interference photolithography has gradually become the mainstream of large area and high-accuracy grating manufacturing technologies.

The main difficulty for laser interference photolithography is the precision control in the manufacture of large-area and high-accuracy grating, and the research and development of high-accuracy interference photolithography systems are very difficult. Many famous grating manufacturing system companies and research institutions in the world have carried out a series of researches on high-accuracy interference photolithography systems. The researches mainly focus on high-accuracy interference photolithography systems. The high-speed and high-precision pattern locking technology in the high-precision interferometric photolithography system can directly determine the pattern locking accuracy of the interferometric photolithography system, wherein the phase measurement method related to the laser exposure beam is the central technology unit in the research and development.

Some scholars have proposed a relative commonly used interference pattern phase locking system. An exposure light source forms an interference pattern on the substrate through the optical path for beam splitting and reflecting. Due to the influence of vibration and air disturbance outside, the interference pattern on the substrate may drift, and thereby affecting the exposure quality. The light introduced from the two exposure beams are coincided and incident on the CCD (Charge-coupled Device) to form interference fringes. The CCD monitors the movement of the spatial interference fringe image to obtain a drift amount of the interference pattern on the substrate, and inputs the drift amount to a controller as feedback. The controller controls a piezoelectric ceramic to drive a reflector holder to adjust the phase of the interference pattern, so as to lock the interference pattern, to obtain better exposure quality. Since the piezoelectric ceramic has a wide modulation range and a relatively lower modulation speed, and due to the limitations of resolution of CCD and frame rate, it is difficult to measure phase in real time to perform high-speed and high-precision phase modulation.

Some scholars also have proposed a solution of a phase locking system based on homodyne phase measurement interferometer. The exposure light source forms an interference pattern on the substrate through an optical path for beam splitting and reflecting. In order to prevent the interference pattern from drifting, the system utilizes a beam splitter near the substrate to extract left and right exposure beams respectively to form two interference signals with a phase difference of 180°, and the interference signals are subjected to differential amplification after being photoelectric conversed to obtain voltage signals. The interference pattern has a phase shift due to external interference, thus the voltage signal changes, and the voltage signal is used as feedback to control an electro-optic modulator EOM (Electro-optic Modulator) to adjust the phase of the interference pattern, to maintain the voltage to be stable, thereby locking the interference pattern. The measurement signal of the used dual-channel homodyne heterodyne phase measurement interferometer is a DC signal, which has poor anti-interference ability and is difficult to achieve high-precision measurement, and it is also very difficult in phase solution, subdivide and direction determination.

A U.S. Pat. No. 6,882,477B1 discloses a scanning laser interference photolithography system. This photolithography system uses two collimated small-size beams which are interference to form an interference pattern, the interference pattern exposes a substrate which is performing a step scanning motion, so as to realize the manufacturing of large-area gratings. The interference of the collimated small-size beams effectively eliminates the phase nonlinear error of the interference pattern. At the same time, in order to prevent the error caused by the phase drift of the system interference pattern relative to the moving substrate platform, this photolithography system exemplifies a pattern locking device based on a heterodyne measurement principle. The pattern locking device generates the frequency difference of heterodyne phase measurement by arranging three acousto-optic modulators in an interference light path, samples an interference beam by a beam sampler to a heterodyne phase meter to perform pattern phase detection, and feeds back the detected phase to a controller to control the phase modulation of the acousto-optic modulators, so as to realize pattern locking. The pattern locking device has the advantages of pattern phase locking in high speed and high accuracy etc., but in the manufacturing process of the gratings having variable periods, the deviation of the exposure beam will separate the measuring beam spot, thus it is impossible to measure and cannot lock the fringe in real time for the interference exposure system having variable periods.

In summary, the exposure beam phase measurement in the technical solutions of the prior art has certain limitations, and it is difficult to measure phase in real time to control the fringe of interferometric exposure system having variable periods.

SUMMARY

In order to solve the above technical problem, the present application provides an exposure light beam phase measurement method for laser interference photolithography, which uses a laser phase measurement interferometer to measure a phase of an exposure light beam for laser interference photolithography, and the laser phase measurement interferometer comprises a first wave plate, a first polarized beam-splitting prism, a second wave plate, a second polarized beam-splitting prism, a polarizer, a first photoelectric detector, a second photoelectric detector, a third polarized beam-splitting prism, a reflector, a third wave plate, a backward reflector and a fourth wave plate, and the exposure light beam phase measurement method comprises the following steps:

separating two measurement light beams from two exposure light beams for laser interference photolithography respectively, wherein the two measurement light beams are parallel with each other, and the two measurement light beams are respectively used as a first input light beam and a second input light beam of the laser phase measurement interferometer;

inputting the first input light beam with a s polarization state to the third polarized beam-splitting prism, reflected by the third polarized beam-splitting prism to the second polarized beam-splitting prism, and then reflected by the second polarized beam-splitting prism to the polarizer to form a first measurement light;

inputting the second input light beam with a s polarization state to the third polarized beam-splitting prism, reflected by the third polarized beam-splitting prism to the second polarized beam-splitting prism, and then reflected by the second polarized beam-splitting prism to the polarizer, to form a second measurement light;

introducing a reference light beam homologous with the exposure light beams for laser interference photolithography as a third input light beam of the laser phase measurement interferometer, wherein the third input light beam is input to the first wave plate, changed into a circular polarization state after passing through the first wave plate and incident on the first polarized beam-splitting prism, and split into a reflection reference light and a transmission reference light by the first polarized beam-splitting prism;

the reflection reference light passing through the fourth wave plate and propagating to the backward reflector, reflected back and turned to the fourth wave plate, so as to be changed into a p polarization state, and transmitted by the first polarized beam-splitting prism and the second polarized beam-splitting prism sequentially, and then passing through the polarizer to form a first reference light beam;

the transmitted reference light passing through the third wave plate and propagating to the reflector, reflected back by the reflector and turned to the third wave plate so as to be changed into a s polarization state and propagating to the first polarized beam-splitting prism, reflected by the first polarized beam-splitting prism to the second wave plate so as to be changed into a p polarization state, and then transmitted by the second polarized beam-splitting prism and passing through the polarizer to form a second reference light beam; and combing the first measurement light and the first reference light beam to form one beam of interferometric optical signal to incident on the first photoelectric detector, and combing the second measurement light and the second reference light beam to form another beam of interferometric optical signal to incident on the second photoelectric detector, the first photoelectric detector and the second photoelectric detector respectively converting the received interferometric optical signals into electrical signals, and calculating on the electrical signals to obtain phases of the two exposure light beams for laser interference photolithography.

Further, the first wave plate of the laser phase measurement interferometer is a quarter wave plate.

Further, the second wave plate of the laser phase measurement interferometer is a half wave plate.

Further, the third wave plate of the laser phase measurement interferometer is a quarter wave plate.

Further, the fourth wave plate of the laser phase measurement interferometer is a quarter wave plate.

Preferably, the measurement light beams used as the first input light beam and the second input light beam of the laser phase measurement interferometer are separated from the two exposure light beams for laser interference photolithography at a latter half of an optical path.

Preferably, the two exposure light beams for laser interference photolithography are focused on a substrate through a convex lens for exposure at the end of the optical path to form a grating, and the measurement light beams used as the first input light beam and the second input light beam of the laser phase measurement interferometer are obtained by separating after passing through the convex lens. Furthermore, a beam splitting prism is used to separate the measurement light beams from the two exposure light beams.

The present application also provides a laser interference photolithography system, which uses the above the exposure light beam phase measurement method for laser interference photolithography. The laser interference photolithography system comprises a laser phase measurement interferometer, a controller and a phase modulator, and the controller is connected to the laser phase measurement interferometer and the phase modulator, and phases of two exposure light beams measured in real time by the laser phase measurement interferometer are fed back to the controller. When a phase measurement result indicates that the phases are shifted, the controller controls the phase modulator to perform phase modulation on the exposure light beams, so as to realize locking of a phase shift of an exposure fringe. Preferably, the phase modulator is an acousto-optic modulator.

The exposure beam phase measurement method for laser interference photolithography provided in the present application utilizes a heterodyne measurement method, and has the advantages of high speed and high accuracy, simple optical structure, high laser utilization, and the laser phase measurement interferometer is an essential component in the laser interference photolithography system for manufacturing a grating having a variable period. The laser phase measurement interferometer utilizes a fringe locking principle based on the heterodyne measurement principle to realize the fringe control of the interference exposure system having a variable period, and has the advantages of high-speed and high-precision measurement, simple optical path and high laser utilization, and can measure the phase of the exposure light beam in real time. The laser interference photolithography system also provided by the present application applies the above-described exposure light beam phase measurement method in the laser interference photolithography to ensure that the output measurement signals are always combined and the signal intensity does not change, and measure the phase of the exposure light beam in real time, thereby to control the exposure interference fringes in real time, and realize high-speed and high-precision control, and improve the entire performance of the laser interference photolithography system.

Figure 1:
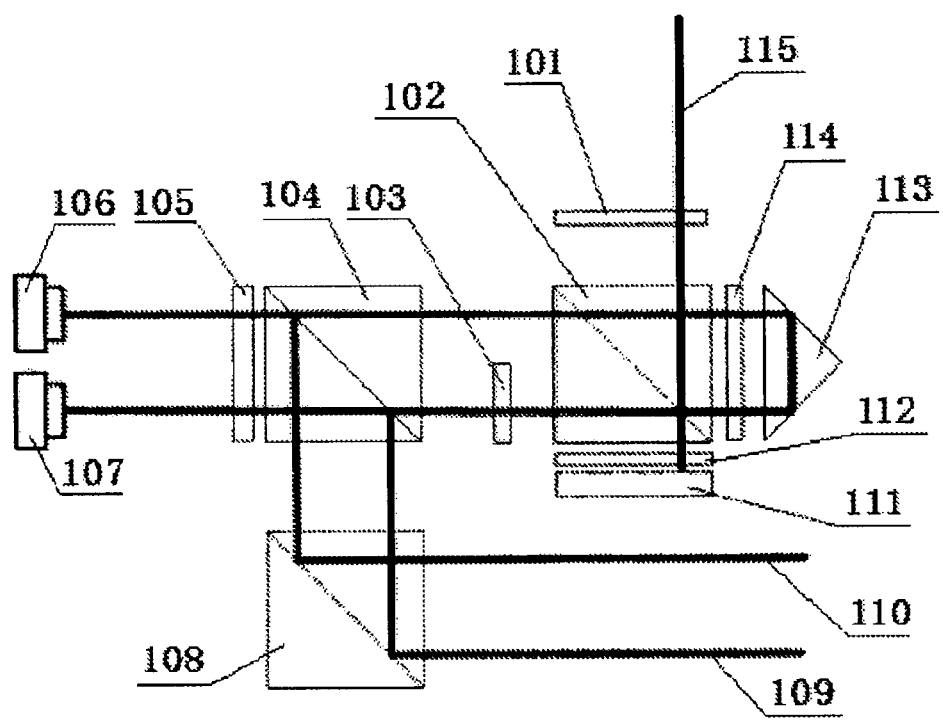
FIG. 1 is a schematic diagram of an optical path structure of a laser phase measurement interferometer of the present application.

In the drawings: 1—laser phase measurement interferometer, 101—first wave plate, 102—first polarized beam-splitting prism, 103—second wave plate, 104—second polarized beam-splitting prism, 105—polarizer, 106—first photoelectric detector, 107—second photoelectric detector, 108—third polarized beam-splitting prism, 109—second input light beam, 110—first input light beam, 111—reflector, 112—third wave plate, 113—backward reflector, 114—fourth wave plate, 115—third input light beam, 2—controller, 201—signal receiving terminal, 202—display screen, 203—calculation module, 204—execution module, 3—laser device, 4—first acousto-optic modulator, 5—first reflector, 6—second reflector, 7—grating, 8—second acousto-optic modulator, 9—third acousto-optic modulator, 10—third reflector, 11—first lens, 12—second lens, 13—fourth reflector, 14—beam-splitting prism, 15—third lens, 16—substrate, 17—fifth reflector, 18—fourth lens, 19—sixth reflector.

DETAILED DESCRIPTION OF EMBODIMENTS

In order to further set forth the technical means for solving the technical problems and the technical effects of the present application, the present application is further described in detail below in combination with the accompanying drawings and specific embodiments. It should be noted that the accompanying drawings provided are schematic and are not exactly drawn according to size or scale; therefore, the protection scope of the present application is not limited to the accompanying drawings and specific embodiments.

A optical path structure of a laser phase measurement interferometer used in the method of the present application shown in FIG. 1 comprises a first wave plate 101, a first polarized beam-splitting prism 102, a second wave plate 103, a second polarized beam-splitting prism 104, a polarizer 105, a first photoelectric detector 106, a second photoelectric detector 107, a third polarized beam-splitting prism 108, a reflector 111, a third wave plate 112, a backward reflector 113 and a fourth wave plate 114. The first wave plate 101, the third wave plate 112, and the fourth wave plate 114 are all quarter wave plates, and the second wave plate 103 is a half wave plate; two measurement light beams are separated from two exposure light beams for laser interference photolithography respectively, wherein the two measurement light beams are parallel with each other, and the two measurement light beams are respectively used as a first input light beam and a second input light beam of the laser phase measurement interferometer, and a optical path structure of the laser phase measuring interferometer is as follows:

The first input beam 110 having a frequency $f_{s1}$ and with a s polarization state is input to the third polarized beam-splitting prism 108, reflected by the third polarized beam-splitting prism 108 to the second polarized beam-splitting prism 104, and then reflected by the second polarized beam-splitting prism 104 to the polarizer 105 to form a first measurement light.

The second input light beam 109 is parallel to the first input light beam 110, has a frequency $f_{s2}$ and is with the s polarization state, the second input light beam 109 is input to the third polarized beam-splitting prism 108, reflected by the third polarized beam-splitting prism 108 to the second polarized beam-splitting prism 104, and then reflected by the second polarized beam-splitting prism 104 to the polarizer 105 to form a second measurement light.

A third input light beam 115 is a reference light beam homologous with the exposure beams for laser interference photolithography, has a frequency $f_{s3}$ and is with the s polarization state, and the third input beam 115 is input to the first wave plate 101, changed into a circular polarization state after passing through the first wave plate 101, and then incident on the first polarized beam-splitting prism 102, and split into a reflection reference light and a transmission reference light by the first polarized beam-splitting prism 102. The reflection reference light passes through the fourth wave plate 114 and propagates to the backward reflector 113, is reflected back by the backward reflector 113 and turned to the fourth wave plate 114, so as to be changed into a p polarization state, and transmitted by the first polarized beam-splitting prism 102 and the second polarized beam-splitting prism 104 sequentially, and then passes through the polarizer 105 to form a first reference light beam. The transmitted reference light passes through the third wave plate 112 and propagates to the reflector 111, is reflected back by the reflector 111 and turned to the third wave plate 112 so as to be changed into a s polarization state and propagates to the first polarized beam-splitting prism 102, and is reflected by the first polarized beam-splitting prism 102 to the second wave plate 103 so as to be changed into a p polarization state, and then is transmitted by the second polarized beam-splitting prism 104 and passes through the polarizer 105 to form a second reference light beam.

The first measurement light and the first reference light beam are combined to form one beam of interferometric optical signal to incident on the first photoelectric detector 106, and the second measurement light and the second reference light beam are combined to form another beam of interferometric optical signal to incident on the second photoelectric detector 107. The first photoelectric detector 106 and the second photoelectric detector 107 respectively convert the received interferometric optical signals into electrical signals, and calculate on the electrical signals to obtain phases of the exposure light beams.

Figure 2:
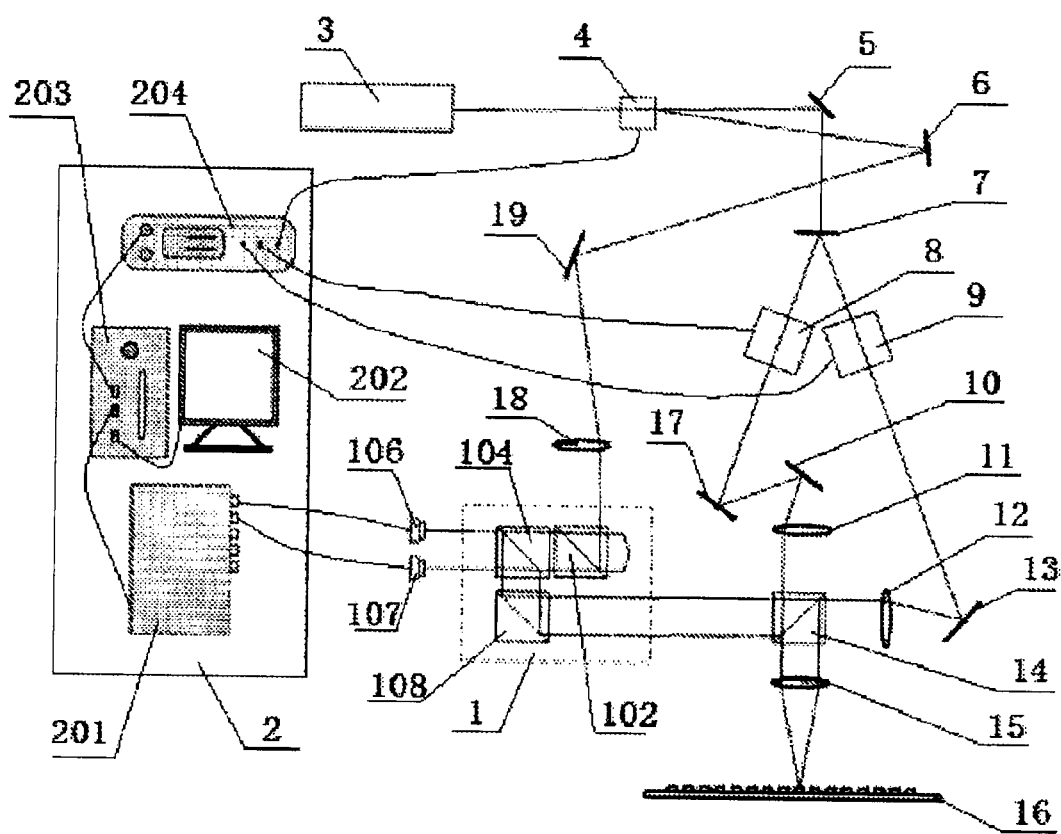
FIG. 2 is a schematic diagram of an embodiment of a laser interference photolithography system using the method of the present application.

An optional embodiment of the laser interference photolithography system applying the method of the present application shown in FIG. 2 comprises a laser phase measurement interferometer 1, a controller 2, a laser device 3, a first acousto-optic modulator 4, a first reflector 5, a second reflector 6, a grating 7, a second acousto-optic modulator 8, a third acousto-optic modulator 9, a third reflector 10, a first lens 11, a second lens 12, a fourth reflector 13, a beam-splitting prism 14, a third lens 15, a fifth reflector 17, a fourth lens 18 and a sixth reflector 19. The first lens 11, the second lens 12, the third lens 15 and the fourth lens 18 are all convex lenses, wherein the controller 2 comprises a signal receiving terminal 201, a display screen 202, a calculation module 203 and an execution module 204. The signal receiving terminal 201 is connected to the first photoelectric detector 106 and the second photoelectric detector 107 of the laser phase measurement interferometer 1 respectively, the calculation module 203 is connected to the display screen 202, the signal receiving terminal 201 and the execution module 204 respectively, and the execution module 204 is connected to the second acousto-optic modulator 8 and the third acousto-optic modulator 9 respectively, and the display screen 202 realizes data visualization. The structure of the laser interference photolithography system is as follows:

A laser light emitted by the laser device 3 is divided into a zero-order diffracted light and a first-order diffracted light by the first acousto-optic modulator 4.

The zero-order diffracted light passes through the first reflector 5 and the grating 7 to be divided into two beams of light. One beam of light passes through the second acousto-optic modulator 8 and has a frequency $f_{s2}$, and then passes through the fifth reflector 17, the third reflector 10 and the first lens 11 sequentially and propagates to the beam-splitting prism 14, and is transmitted by the beam-splitting prism 14 and then passes through the third lenses 15 to focus on the substrate 16 for exposure, then this beam of light is reflected by the beam-splitting prism 14 to be used as a second input beam of the laser phase measurement interferometer 1. Another beam of light passes through the third acousto-optic modulator 9 and has additional frequency $f_{s1}$, and then passes through the fourth reflector 13 and the second lens 12 sequentially and propagates to the beam-splitting prism 14, and is reflected by the beam-splitting prism 14 and then passes through the third lenses 15 to focus on the substrate 16 for exposure, then this beam is transmitted by the beam-splitting prism 14 to be used as a first input beam of the laser phase measurement interferometer 1.

The first-order diffracted light is used as the reference light and has a frequency $f_{s3}$, and passes through the second reflector 6, the sixth reflector 19 and the fourth lens 18 to be used as a third input beam of the laser phase measurement interferometer 1.

The first input light beam, the second input light beam and the third input light beam are processed by the laser phase measurement interferometer 1 to form a first measurement light, a second measurement light, a first reference light beam and a second reference light beam, and the first measurement light and the first reference light beam are combined into one interferometric optical signal, and the second measurement light and the second reference light beam are combined into another interferometric optical signal; additional frequency $f_{s1}=f_{s2}$, and the frequencies of the two interferometric optical signals are the same. When the exposure period for laser interference photolithography changes, the distance between the measurement light changes, shift to a center or an edge of the third polarized beam-splitting prism, and a heterodyne measurement light beam shifts towards the center or the edge of the third polarized beam-splitting prism by the same distance, to ensure that the measurement light and the reference light beam are always combined to form an interferometric optical signal. The intensity of the interferometric optical signal may not change accordingly. The obtained two interferometric optical signals are incident on the first photoelectric detector 106 and the second photoelectric detector 107 respectively, the first photoelectric detector 106 and the second photoelectric detector 107 convert the optical signals into electrical signals and transfer the electrical signals to the signal receiving terminal 201, and the signal receiving terminal 201 transfers it to the calculation module 203 to perform the calculation so as to obtain the phase of the exposure beam. When the phase measurement result indicates that the phase has shifted, a compensation instruction is generated according to the phase drift information of exposure light beam and is transferred to the execution module 204, and the execution module 204 issues the compensation instruction to the second acousto-optic modulator 8 and the third acousto-optic modulator 9 to modulate the phase of the exposure light beam, so as to achieve the locking of the phase drift of the exposure fringes, thereby controlling the fringe of the exposure for laser interference photolithography having a variable period in real time.

The principle of forming the interferometric optical signal of the laser phase measurement interferometer used in the method of the present application is further described below.

The light vector matrix of a first input beam s1 may be expressed as:

$$E_{s1} = E_1 expi(-2\pi f_{s1}t + \varphi_{s1})\begin{bmatrix}0\\1\end{bmatrix}$$

wherein:

$E_{s1}$ represents a light vector matrix of the first input beam s1;

$E_1$ represents an amplitude of the first input beam s1;

i represents an imaginary unit;

$f_{s1}$ represents a vibration frequency of the first input beam s1 including the additional frequency;

t represents a time that the laser propagates in the space;

$\varphi_{s1}$ represents an initial phase of the first input beam s1.

The light vector matrix of a second input beam s2 may be expressed as:

$$E_{s2} = E_2 expi(-2\pi f_{s2}t + \varphi_{s2})\begin{bmatrix}0\\1\end{bmatrix}$$

wherein:

$E_{s2}$ represents a light vector matrix of the second input beam s2;

$E_2$ represents a amplitude of the second input beam s2;

$f_{s2}$ represents a vibration frequency of the second input beam s2 including a frequency;

$\varphi_{s2}$ represents an initial phase of the second input beam s2.

A third input beam s3 is a heterodyne measurement reference beam, and its light vector matrix may be expressed as:

$$E_{s3} = E_3 expi(-2\pi f_{s3}t + \varphi_{s3})\begin{bmatrix}0\\1\end{bmatrix}$$

wherein:

$E_{s3}$ represents a light vector matrix of the third input beam s3;

$E_3$ represents an amplitude of the third input beam s3;

$f_{s3}$ represents a vibration frequency of the third input beam s3 including a frequency, $f_{s3}$ is different from $f_{s2}$ and $f_{s1}$;

$\varphi_{s3}$ represents an initial phase of the third input beam s3.

The first measurement light is formed by making the first input beam s1 passing through the following light path: s1→PBSR3 (reflected by the third polarized beam-splitting prism)→PBSR2 (reflected by the second polarized beam-splitting prism)→PF (the polarizer arranged at an angle of 45°). Therefore, the light vector of the first measurement light is:

$$E_{s11} = J_{PF}J_{PBSR3}J_{PBSR2}E_{s1} = E_1 expi(-2\pi f_{s1}t + \varphi_{s1})\begin{bmatrix}1\\1\end{bmatrix}$$

wherein:

$E_{s11}$ represents a light vector matrix of the first measurement light;

$J_{PF}$ represents a Jones matrix of the transmitted light path of the polarizer;

$J_{PBSR2}$ represents a Jones matrix of a reflection light path of the second polarized beam-splitting prism;

$J_{PBSR3}$ represents a Jones matrix of a reflection light path of the third polarized beam-splitting prism.

The first reference light is formed by making the split third input beam s3 passing through the following light path: s3→QW1 (the first wave plate with a fast axis arranged at an angle of 45°)→PBSR1 (reflected by the first polarized beam-splitting prism)→QW4 (the fourth wave plate with a fast axis arranged at an angle of 45°)→RR (backward reflector)→QW4 (the fourth wave plate with a fast axis arranged at an angle of 45°)→PBST1 (transmitted by the first polarized beam-splitting prism)→PBST2 (transmitted by the second polarized beam-splitting prism)→PF (the polarizer arranged at an angle of 45°). Therefore, the light vector of the first reference light beam is:

$$E_{s31} = J_{PF}J_{PBST1}J_{PBST2}J_{QW1}J_{RR}J_{QW4}J_{PBSR1}J_{QW4}E_{s3} =$$
$$E_3 expi(-2\pi f_{s3}t + \varphi_{s3})\begin{bmatrix}1+i\\1+i\end{bmatrix}$$

wherein:

$E_{s31}$ represents a light vector matrix of the first reference light beam;

$J_{PBST1}$ represents a Jones matrix of the transmitted light path of the first polarized beam-splitting prism;

$J_{PBST2}$ represents a Jones matrix of the transmitted light path of the second polarized beam-splitting prism;

$J_{QW1}$ represents a matrix of the transmitted light path of the first wave plate; and $J_{QW4}$ represents a matrix of the transmitted light path of the fourth wave plate.

The first measurement light and the first reference light beam are combined to form a beam of interferometric signal to incident on the first photoelectric detector 106. Therefore, the light intensity value of the interferometric signal obtained by the first photoelectric detector 106 can be obtained:

$$I_1 = (E_{s11} + E_{s31})\overline{(E_{s11} + E_{s31})} = E_1^2 + E_3^2 + 2E_1 E_3 \cos(-2\pi \Delta f_1 t + \Delta\varphi_1)$$

wherein:

$I_1$ represents the light intensity of the interferometric optical signal formed by combining the first measurement light and the first reference light beam;

$\Delta f_1$ represents a vibration frequency of the interferometric optical signal formed by combining the first measurement light and the first reference light beam;

$\Delta\varphi_1$ represents a phase of the interferometric optical signal formed by combining the first measurement light and the first reference light beam.

The second measurement light is formed by the second input light beam s2 passing through the following light path: s2→PBSR3 (reflected by the third polarized beam-splitting prism)→PBSR2 (reflected by the second polarized beam-splitting prism)→PF (the polarizer arranged at an angle of 45°). Therefore, the light vector of the second measurement light is:

$$E_{s21} = J_{PF}J_{PBSR2}J_{PBSR3}E_{s2} = E_2 expi(-2\pi f_{s2}t + \varphi_{s2})\begin{bmatrix}1\\1\end{bmatrix}$$

wherein:

$E_{s21}$ represents a light vector matrix of the second measurement light.

The second reference light is formed by making the split third input beam s3 passing through the following light path: s3→QW1 (the first wave plate with a fast axis arranged at an angle of 45°)→PBST1 (transmitted by the first polarized beam-splitting prism)→QW3 (the third wave plate with a fast axis arranged at an angle of 45°)→R (the reflector)→QW3 (the third wave plate with a fast axis arranged at an angle of 45°)→PBSR1 (reflected by the first polarized beam-splitting prism)→HW (the second wave plate arranged at an angle of 45°)→PBST2 (transmitted by the second polarized beam-splitting prism)→PF (the polarizer arranged at an angle of 45°). Therefore, the light vector of the second reference light is:

$$E_{s32} = J_{PF}J_{PBST1}J_{HW}J_{PBSR1}J_{QW1}J_R J_{QW3}J_{PBST2}J_{QW3}E_{s3} =$$
$$E_3 expi(-2\pi f_{s3}t + \varphi_{s3})\begin{bmatrix}1+i\\1+i\end{bmatrix}$$

wherein:

$E_{s32}$ represents a light vector matrix of the second reference light;

$J_{PBSR1}$ represents a Jones matrix of the reflected light path of the first polarized beam-splitting prism;

$J_{QW3}$ represents a matrix of the transmitted light path of the third wave plate; and $J_{HW}$ represents a matrix of the transmitted light path of the second wave plate.

The second measurement light and the second reference light beam are combined to form another beam of interferometric signal to incident on the second photoelectric detector 107. Therefore, the light intensity value of the interferometric signal obtained by the second photoelectric detector 107 can be obtained:

$$I_2 = (E_{s21} + E_{s32})\overline{(E_{s21} + E_{s32})} = E_2^2 + E_3^2 + 2E_2E_3\cos(-2\pi\Delta f_2 t + \Delta\varphi_2)$$

wherein:
$I_2$ represents a light intensity of the interferometric optical signal formed by combining the second measurement light and the second reference light beam;
$\Delta f_2$ represents a vibration frequency of the interferometric optical signal formed by combining the second measurement light and the second reference light beam;
$\Delta\varphi_2$ represents a phase of the interferometric optical signal formed by combining the second measurement light and the second reference light beam.

The combined two interferometric optical signals have the same frequency differences, include the phase information of the measured input beams s1 and s2 and the input heterodyne reference light s3, and are transferred to the calculation module for processing through the signal processing terminal after being converted into electrical signals, so as to calculate the phase of the exposure light beam, and achieve the phase measurement of the exposure light beam.

Obviously, the present application can also have a variety of other embodiments. Those skilled in the art may make various corresponding changes and deformations according to the present application without departing from the spirit and essence of the present application, and these corresponding changes and deformations belong to the protection scope of the claims of the present application.

The invention claimed is:

1. An exposure light beam phase measurement method for laser interference photolithography, wherein a variable period interference fringe phase measurement method based on heterodyne measurement principle uses a laser phase measurement interferometer to measure a phase of an exposure light beam for laser interference photolithography, the laser phase measurement interferometer comprises a first wave plate, a first polarized beam-splitting prism, a second wave plate, a second polarized beam-splitting prism, a polarizer, a first photoelectric detector, a second photoelectric detector, a third polarized beam-splitting prism, a reflector, a third wave plate, a backward reflector and a fourth wave plate, and the exposure light beam phase measurement method comprises the following steps:

separating two measurement light beams from two exposure light beams for laser interference photolithography respectively, wherein the two measurement light beams are parallel with each other, and the two measurement light beams are respectively used as a first input light beam and a second input light beam of the laser phase measurement interferometer;

inputting the first input light beam having a frequency $f_{s1}$ and with a s polarization state to the third polarized beam-splitting prism, reflected by the third polarized beam-splitting prism to the second polarized beam-splitting prism, and then reflected by the second polarized beam-splitting prism to the polarizer to form a first measurement light;

inputting the second input light beam having a frequency $f_{s2}$ and with a s polarization state to the third polarized beam-splitting prism, reflected by the third polarized beam-splitting prism to the second polarized beam-splitting prism, and then reflected by the second polarized beam-splitting prism to the polarizer to form a second measurement light;

inputting a reference light beam homologous with the exposure light beams for laser interference photolithography as a third input light beam of the laser phase measurement interferometer, wherein the third input light beam having a frequency $f_{s3}$ is input to the first wave plate, changed into a circular polarization state after passing through the first wave plate and incident on the first polarized beam-splitting prism, and split into a reflection reference light and a transmission reference light by the first polarized beam-splitting prism;

the reflection reference light passing through the fourth wave plate and propagating to the backward reflector, reflected back by the backward reflector and turned to the fourth wave plate so as to be changed into a p polarization state, and transmitted by the first polarized beam-splitting prism and the second polarized beam-splitting prism sequentially, and then passing through the polarizer to form a first reference light beam;

the transmitted reference light passing through the third wave plate and propagating to the reflector, reflected back by the reflector and turned to the third wave plate so as to be changed into a s polarization state and propagating to the first polarized beam-splitting prism, reflected by the first polarized beam-splitting prism to the second wave plate so as to be changed into a p polarization state, and then transmitted by the second polarized beam-splitting prism and passing through the polarizer to form a second reference light beam; and combing the first measurement light and the first reference light beam to form one beam of interferometric optical signal to incident on the first photoelectric detector, and combing the second measurement light and the second reference light beam to form another beam of interferometric optical signal to incident on the second photoelectric detector, the first photoelectric detector and the second photoelectric detector respectively converting the received interferometric optical signals into electrical signals, and calculating on the electrical signals to obtain phases of the two exposure light beams for laser interference photolithography.

2. The exposure light beam phase measurement method for laser interference photolithography according to claim 1, wherein the first wave plate of the laser phase measurement interferometer is a quarter wave plate.

3. The exposure light beam phase measurement method for laser interference photolithography according to claim 1, wherein the second wave plate of the laser phase measurement interferometer is a half wave plate.

4. The exposure light beam phase measurement method for laser interference photolithography according to claim 1, wherein the third wave plate of the laser phase measurement interferometer is a quarter wave plate.

5. The exposure light beam phase measurement method for laser interference photolithography according to claim 1, wherein the fourth wave plate of the laser phase measurement interferometer is a quarter wave plate.

6. The exposure light beam phase measurement method for laser interference photolithography according to claim 1, wherein the measurement light beams used as the first input light beam and the second input light beam of the laser phase measurement interferometer are separated from the two exposure light beams for laser interference photolithography at a latter half of an optical path.

7. The exposure light beam phase measurement method for laser interference photolithography according to claim 1, wherein the two exposure light beams for laser interference photolithography are focused on a substrate through a convex lens for exposure so as to form a grating, and the measurement light beams used as the first input light beam and the second input light beam of the laser phase measurement interferometer are obtained by separating after passing through the convex lens.

8. The exposure light beam phase measurement method for laser interference photolithography according to claim 1, wherein a beam splitting prism is used to separate the measurement light beams from the two exposure light beams.

9. A laser interference photolithography system, comprising the laser phase measurement interferometer, a controller and a phase modulator, and the controller is connected to the laser phase measurement interferometer and the phase modulator, and phases of two exposure light beams measured in real time by the laser phase measurement interferometer are fed back to the controller; when a phase measurement result indicates that the phases are shifted, the controller controls the phase modulator to perform phase modulation on the exposure light beams, so as to realize locking of a phase shift of an exposure fringe; wherein the phases of two exposure light beams measured in real time by the laser phase measurement interferometer are measured by the method of claim 1.

10. The laser interference photolithography system according to claim 9, wherein the phase modulator is an acousto-optic modulator.

* * * * *